US012580576B2

(12) United States Patent
Kuroda et al.

(10) Patent No.: US 12,580,576 B2
(45) Date of Patent: Mar. 17, 2026

(54) SUCCESSIVE APROXIMATION REGISTER ANALOG TO DIGITAL CONVERTERS INCLUDING BUILT-IN SELF-TEST

(71) Applicant: Cypress Semiconductor Corporation, San Jose, CA (US)

(72) Inventors: Susumu Kuroda, Aichi-pref (JP); Masashi Kijima, Aichi (JP); Rajiv Singh, Bothell, WA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 117 days.

(21) Appl. No.: 18/423,875

(22) Filed: Jan. 26, 2024

(65) Prior Publication Data

US 2025/0247103 A1 Jul. 31, 2025

(51) Int. Cl.
*H03M 1/10* (2006.01)

(52) U.S. Cl.
CPC ................................. *H03M 1/1071* (2013.01)

(58) Field of Classification Search
CPC .................................................. H03M 1/1071
See application file for complete search history.

(56) References Cited

U.S. PATENT DOCUMENTS

| | | | |
|---|---|---|---|
| 11,424,754 B1* | 8/2022 | Berens | H03M 1/1057 |
| 2007/0182612 A1* | 8/2007 | Peterson | H03M 1/1071 |
| | | | 341/144 |

* cited by examiner

*Primary Examiner* — Benyam Haile

(57) ABSTRACT

A Successive Approximation Register (SAR) Analog to Digital Converter (ADC) includes a Capacitive Digital to Analog Converter (CDAC), a comparator, and control logic. The CDAC includes a plurality of trim capacitors addressed via a trimming code. The comparator is coupled to the CDAC to compare an output voltage of the CDAC to a common mode voltage (VCM) to output a logic high value or a logic low value based on the comparison. The control logic includes SAR ADC control logic to control the CDAC and the comparator in a SAR ADC mode and Built-In Self-Test (BIST) control logic to control the CDAC and the comparator in a CDAC BIST mode to set at least one trimming code for the SAR ADC mode.

15 Claims, 6 Drawing Sheets

SUCCESSIVE APROXIMATION REGISTER ANALOG TO DIGITAL CONVERTERS INCLUDING BUILT-IN SELF-TEST

BACKGROUND

A Successive Approximation Register (SAR) Analog to Digital Converter (ADC) may include a Capacitive Digital to Analog Converter (CDAC) including an array of Least Significant Bit (LSB) capacitors, an array of Most Significant Bit (MSB) capacitors, and an array of trim capacitors to trim mismatch in capacitance for the least significant bit of the array of MSB capacitors. The array of trim capacitors are addressed via a trimming code. To select a trimming code for the array of trim capacitors, a circuit external to the SAR ADC may perform an ADC differential non-linearity (DNL) test for each potential trimming code, and the trimming code with the optimum result may be selected. Thus, selecting the trimming code is time consuming (e.g., greater than 2 seconds) and requires additional circuitry external to the SAR ADC.

For these and other reasons, a need exists for the present invention.

SUMMARY

Some examples of the present disclosure relate to a Successive Approximation Register (SAR) Analog to Digital Converter (ADC). The SAR ADC includes a Capacitive Digital to Analog Converter (CDAC), a comparator, and control logic. The CDAC includes a plurality of trim capacitors addressed via a trimming code. The comparator is coupled to the CDAC to compare an output voltage of the CDAC to a common mode voltage (VCM) to output a logic high value or a logic low value based on the comparison. The control logic includes SAR ADC control logic to control the CDAC and the comparator in a SAR ADC mode and Built-In Self-Test (BIST) control logic to control the CDAC and the comparator in a CDAC BIST mode to set at least one trimming code for the SAR ADC mode.

Other examples of the present disclosure relate to a system. The system includes a voltage component to output a voltage signal and a SAR ADC to monitor the voltage signal. The SAR ADC includes a CDAC, a comparator, and control logic. The CDAC includes a plurality of trim capacitors addressed via a trimming code. The comparator is coupled to the CDAC to compare an output voltage of the CDAC to a common mode voltage (VCM) to output a logic high value or a logic low value based on the comparison. The control logic includes SAR ADC control logic to control the CDAC and the comparator in a SAR ADC mode and BIST control logic to control the CDAC and the comparator in a CDAC BIST mode to set at least one trimming code for the SAR ADC mode.

Yet other examples of the present disclosure relate to a method. The method includes, in a BIST mode of a SAR ADC, setting a current trimming code to an initial trimming code and setting a current MSB address to an initial MSB address. The method includes implementing a CDAC function for the current MSB address. The method includes checking a comparator output of the SAR ADC a selected number of times to obtain a plurality of comparator output values for the current MSB address and the current trimming code. The method includes in response to the plurality of comparator output values comprising an equal number of logic high values and logic low values within a threshold, storing the current trimming code corresponding to the current MSB address. The method includes in response to the plurality of comparator output values not comprising an equal number of logic high values and logic low values within the threshold and in response to the current trimming code being less than a maximum trimming code, incrementing the current trimming code and repeating the CDAC function for the current MSB address.

DETAILED DESCRIPTION

In the following detailed description, reference is made to the accompanying drawings which form a part hereof, and in which is shown by way of illustration specific examples in which the disclosure may be practiced. It is to be understood that other examples may be utilized and structural or logical changes may be made without departing from the scope of the present disclosure. The following detailed description, therefore, is not to be taken in a limiting sense, and the scope of the present disclosure is defined by the appended claims. It is to be understood that features of the various examples described herein may be combined, in part or whole, with each other, unless specifically noted otherwise.

Disclosed herein is a Successive Approximation Register (SAR) Analog to Digital Converter (ADC) including a Capacitive Digital to Analog Converter (CDAC), a comparator, and control logic that prevents an increase in cost for trimming the CDAC of the SAR ADC by including a trimming test function within a Built-In Self-Test (BIST) circuit of the control logic of the SAR ADC. The trimming may be performed for all combinations of the Most Significant Bit (MSB) capacitors of the CDAC rather than only the least significant bit of the MSB capacitors. By including the trimming function within the BIST circuit, no additional dedicated test circuitry is required to perform the trimming function, thereby reducing trimming time and improving performance compared to SAR ADCs not including the disclosed BIST circuit.

Figure 1:
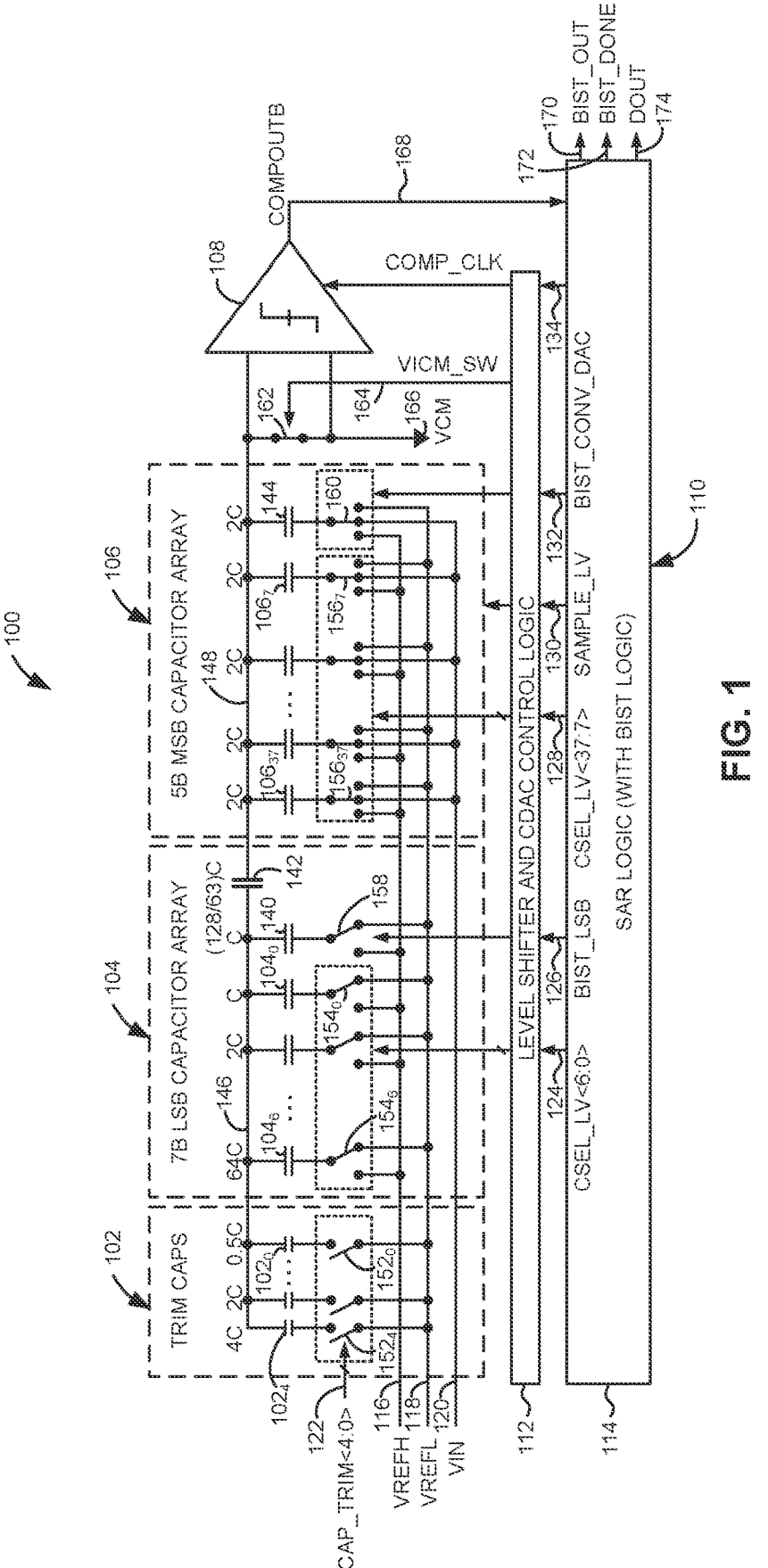
FIG. 1 is a schematic diagram illustrating an example Successive Approximation Register (SAR) Analog to Digital Converter (ADC).

FIG. 1 is a schematic diagram illustrating an example SAR ADC 100. SAR ADC 100 includes a CDAC including a plurality of trim capacitors 102 (e.g., trim capacitor array), a plurality of LSB capacitors 104 (e.g., LSB capacitor array), and a plurality of MSB capacitors 106 (e.g., MSB capacitor array). SAR ADC 100 also includes a comparator 108, and control logic 110. Control logic 110 includes level shifter and CDAC control logic 112 electrically coupled to SAR logic 114 including BIST logic.

The plurality of trim capacitors 102 includes trim capacitors $102_0$ to $102_4$. While trim capacitors $102_1$ to $102_3$ are not labeled in FIG. 1, it will be apparent that trim capacitors $102_1$ to $102_3$ are respectively arranged between trim capacitor $102_0$ and trim capacitor $102_4$. While trim capacitors 102 include five trim capacitors in SAR ADC 100 of FIG. 1, in some examples, SAR ADC 100 may include less than five trim capacitors or more than five trim capacitors. In some examples, trim capacitor $102_0$ may have a capacitance of 0.5 C, where "C" is a unit capacitance. Trim capacitor $102_1$ may have a capacitance of 0.5 C, trim capacitor $102_2$ may have a capacitance of C, trim capacitor $102_3$ may have a capacitance of 2 C, and trim capacitor $102_4$ may have a capacitance of 4 C. In other examples, trim capacitors $102_0$ to $102_4$ may have other suitable capacitance values.

One side of each trim capacitor $102_0$ to $102_4$ is electrically coupled to a node 146, and the other side of each trim capacitor $102_0$ to $102_4$ is electrically coupled to a first terminal of a switch $152_0$ to $152_4$, respectively. While switches $152_1$ to $152_3$ are not labeled in FIG. 1, it will be apparent that switches $152_1$ to $152_3$ are respectively arranged between switch $152_0$ and switch $152_4$. A second terminal of each switch $152_0$ to $152_4$ is electrically coupled to a low reference voltage (VREFL) node 118. A control input of each switch $152_0$ to $152_4$ is electrically coupled to a capacitor trim signal path 122 to individually control each switch $152_0$ to $152_4$ based on a capacitor trimming code CAP_TRIM<4:0>. For example, in response to a logic high trimming code corresponding to a switch $152_0$ to $152_4$, the corresponding switch may be closed (e.g., the first terminal is connected to the second terminal) to connect the corresponding trim capacitor $102_0$ to $102_4$ to VREFL node 118. In response to a logic low trimming code corresponding to a switch $152_0$ to $152_4$, the corresponding switch may be opened (e.g., the first terminal is disconnected from the second terminal) to disconnect the corresponding trim capacitor $102_0$ to $102_4$ from VREFL node 118. In some examples, the logic levels of the trimming code may be reversed such that a logic low trimming code closes the corresponding switch and a logic high trimming code opens the corresponding switch. Accordingly, the trimming code CAP_TRIM<4:0> addresses the trim capacitors $102_0$ to $102_4$ to trim the CDAC as further described below with reference to FIG. 4.

The plurality of LSB capacitors 104 includes LSB capacitors $104_0$ to $104_6$. While LSB capacitors $104_1$ to $104_5$ are not labeled in FIG. 1, it will be apparent that LSB capacitors $104_1$ to $104_5$ are respectively arranged between LSB capacitor $104_0$ and LSB capacitor $104_6$. While LSB capacitors 104 include seven LSB capacitors in SAR ADC 100 of FIG. 1 to provide a seven bit LSB capacitor array, in some examples, SAR ADC 100 may include less than seven LSB capacitors or more than seven LSB capacitors. In some examples, LSB capacitor $104_0$ may have a capacitance of C, LSB capacitor $104_1$ may have a capacitance of 2 C, LSB capacitor $104_2$ may have a capacitance of 4 C, LSB capacitor $104_3$ may have a capacitance of 8 C, LSB capacitor $104_4$ may have a capacitance of 16 C, LSB capacitor $104_5$ may have a capacitance of 32 C, and LSB capacitor $104_6$ may have a capacitance of 64 C. In other examples, LSB capacitors $104_0$ to $104_6$ may have other suitable capacitance values. The LSB capacitor array 104 may also include a capacitor 140 having a capacitance, for example, of C; and a bridge capacitor 142 having a capacitance, for example, of (128/63) C.

One side of each LSB capacitor $104_0$ to $104_6$ is electrically coupled to node 146, and the other side of each LSB capacitor $104_0$ to $104_6$ is electrically coupled to a first terminal of a switch $154_0$ to $154_6$, respectively. While switches $154_1$ to $154_5$ are not labeled in FIG. 1, it will be apparent that switches $154_1$ to $154_5$ are respectively arranged between switch $154_0$ and switch $154_6$. A second terminal of each switch $154_0$ to $154_6$ is electrically coupled to VREFL node 118. A third terminal of each switch $154_0$ to $154_6$ is electrically coupled to a high reference voltage (VREFH) node 116. A control input of each switch $154_0$ to $154_6$ is electrically coupled to a capacitor select signal path 124 (electrically coupled to SAR logic 114 and conditioned through level shifter and CDAC control logic 112) to individually control each switch $154_0$ to $154_6$ based on a capacitor select control signal CSEL_LV<6:0>. For example, in response to a logic high CSEL_LV<6:0> control signal corresponding to a switch $154_0$ to $154_6$, the corresponding switch may be connected between the first terminal and the second terminal to connect the corresponding LSB capacitor $104_0$ to $104_6$ to VREFL node 118. In response to a logic low CSEL_LV<6:0> control signal corresponding to a switch $154_0$ to $154_6$, the corresponding switch may be connected between the first terminal and the third terminal to connect the corresponding LSB capacitor $104_0$ to $104_6$ to VREFH node 116. In some examples, the logic levels of the CSEL_LV<6:0> control signal may be reversed such that a logic low CSEL_LV<6:0> control signal connects the first terminal to the second terminal of the corresponding switch and a logic high CSEL_LV<6:0> control signal connects the first terminal to the third terminal of the corresponding switch. Accordingly, the control signal CSEL_LV<6:0> is used to address the LSB capacitors $104_0$ to $104_6$.

One side of capacitor 140 is electrically coupled to node 146, and the other side of capacitor 140 is electrically coupled to a first terminal of a switch 158. A second terminal of switch 158 is electrically coupled to VREF node 118. A third terminal of switch 158 is electrically coupled to VREFH node 116. A control input of switch 158 is electrically coupled to a control signal path 126 (electrically coupled to SAR logic 114 and conditioned through level shifter and CDAC control logic 112) to control switch 158 based on a control signal BIST_LSB. For example, in response to a logic high BIST_LSB control signal, switch 158 may be connected between the first terminal and the second terminal to connect capacitor 140 to VREFL node 118. In response to a logic low BIST_LSB control signal, switch 158 may be connected between the first terminal and the third terminal to connect capacitor 140 to VREFH node 116. In some examples, the logic levels of the BIST_LSB control signal may be reversed such that a logic low BIST_LSB control signal connects the first terminal to the second terminal of switch 158 and a logic high BIST_LSB control signal connects the first terminal to the third terminal of switch 158. In some examples, in a SAR ADC mode, switch 158 may be controlled to maintain the connection of capacitor 140 to VREFH node 116, and in a CDAC BIST mode, BIST logic within SAR logic 114 may control switch 158 to connect capacitor 140 to either VREFH node 116 or VREFL node 118 as described below with reference to FIGS. 5A and 5B. One side of bridge capacitor 142 is electrically coupled to node 146, and the other side of bridge capacitor 142 is electrically coupled to node 148.

The plurality of MSB capacitors 106 includes MSB capacitors $106_7$ to $106_{37}$. While MSB capacitors $106_8$ to $106_{36}$ are not labeled in FIG. 1, it will be apparent that MSB capacitors $106_8$ to $106_{36}$ are respectively arranged between MSB capacitor $106_7$ and MSB capacitor $106_{37}$. While MSB capacitors 106 include 31 MSB capacitors in SAR ADC 100 of FIG. 1 selected in various combinations to provide a five bit MSB capacitor array, in some examples, SAR ADC 100 may include less than 31 MSB capacitors or more than 31 MSB capacitors selected in various combinations to provide a less than five bit MSB capacitor array or a more than five bit MSB capacitor array. In some examples, each MSB capacitor $106_7$ to $106_{37}$ may have a capacitance of 2 C. In other examples, each MSB capacitor $106_7$ to $106_{37}$ may have another suitable capacitance value. The MSB capacitor array 106 may also include a capacitor 144 having a capacitance, for example, of 2 C.

One side of each MSB capacitor $106_7$ to $106_{37}$ is electrically coupled to node 148, and the other side of each MSB capacitor $106_7$ to $106_{37}$ is electrically coupled to a first terminal of a switch $156_7$ to $156_{37}$, respectively. While switches $156_8$ to $156_{36}$ are not labeled in FIG. 1, it will be apparent that switches $156_8$ to $156_{36}$ are respectively arranged between switch $156_7$ and switch $156_{37}$. A second terminal of each switch $156_7$ to $156_{37}$ is electrically coupled to VREFL node 118. A third terminal of each switch $156_7$ to $156_{37}$ is electrically coupled to VREFH node 116. A fourth terminal of each switch $156_7$ to $156_{37}$ is electrically coupled to an input voltage (VIN) node 120. A control input of each switch $156_7$ to $156_{37}$ is electrically coupled to a capacitor select signal path 128 (electrically coupled to SAR logic 114 and conditioned through level shifter and CDAC control logic 112) to individually control each switch $156_7$ to $156_{37}$ based on a capacitor select control signal CSEL_LV<37:7>. For example, in response to a first value of the CSEL_LV<37:7> control signal corresponding to a switch $156_7$ to $156_{37}$, the corresponding switch may be connected between the first terminal and the second terminal to connect the corresponding MSB capacitor $106_7$ to $106_{37}$ to VREFL node 118. In response to a second value of the CSEL_LV<37:7> control signal corresponding to a switch $156_7$ to $156_{37}$, the corresponding switch may be connected between the first terminal and the third terminal to connect the corresponding MSB capacitor $106_7$ to $106_{37}$ to VREFH node 116. In response to a third value of the CSEL_LV<37:7> control signal corresponding to a switch $156_7$ to $156_{37}$, the corresponding switch may be connected between the first terminal and the fourth terminal to connect the corresponding MSB capacitor $106_7$ to $106_{37}$ to VIN node 120. Accordingly, the control signal CSEL_LV<37:7> is used to address the MSB capacitors $106_7$ to $106_{37}$.

One side of capacitor 144 is electrically coupled to node 148, and the other side of capacitor 144 is electrically coupled to a first terminal of a switch 160. A second terminal of switch 160 is electrically coupled to VREFL node 118. A third terminal of switch 160 is electrically coupled to VREFH node 116. A fourth terminal of switch 160 is electrically coupled to VIN node 120. A control input of switch 160 is electrically coupled to a control signal path 132 (electrically coupled to SAR logic 114 and conditioned through level shifter and CDAC control logic 112) to control switch 160 based on a control signal BIST_CONV_DAC. For example, in response to a first value of the BIST_CONV_DAC control signal, switch 160 may be connected between the first terminal and the second terminal to connect the capacitor 144 to VREFL node 118. In response to a second value of the BIST_CONV_DAC control signal, switch 160 may be connected between the first terminal and the third terminal to connect the capacitor 144 to VREFH node 116. In response to a third value of the BIST_CONV_DAC control signal, switch 160 may be connected between the first terminal and the fourth terminal to connect the capacitor 144 to VIN node 120. A sample control signal SAMPLE_LV on a control signal path 130 (electrically coupled to SAR logic 114 and conditioned through level shifter and CDAC control logic 112) controls sampling in the SAR ADC.

Node 148 is electrically coupled to a first input of comparator 108 and to a first terminal of a switch 162. A second terminal of the switch 162 is electrically coupled to a second input of comparator 108 and to a common mode voltage (VCM) node 166. A control input of switch 162 is electrically coupled to a control signal path 164 (electrically coupled to level shifter and CDAC control logic 112) to control switch 162 based on a control signal VICM_SW. For example, in response to a logic high VICM_SW control signal, switch 162 may be closed (e.g., the first terminal connected to the second terminal) to connect the node 148 to VCM node 166. In response to a logic low VICM_SW control signal, switch 162 may be opened (e.g., the first terminal disconnected from the second terminal) to disconnect node 148 from VCM node 166. In some examples, the logic levels of the VICM_SW control signal may be reversed such that a logic low VICM_SW control signal closes switch 162 and a logic high VICM_SW control signal opens switch 162.

A clock input of comparator 108 is electrically coupled to a clock signal path 134 (electrically coupled to SAR logic 114 and conditioned through level shifter and CDAC control logic 112) to receive a clock signal COMP_CLK. The comparator 108 compares the signal on the first input (e.g., node 148, which is an output of the CDAC) to the signal on the second input (e.g., VCM) in response to each clock cycle to output a signal COMPOUTB to SAR logic 114 through an output signal path 168. The output signal COMPOUTB may be a logic high value or a logic low value based on the comparison. For example, in response to the output voltage of the CDAC being greater than VCM, comparator 108 may output a logic high value, and in response to the output voltage of the CDAC being less than VCM, comparator 108 may output a logic low value. In response to the output voltage of the CDAC being equal to VCM, comparator 108 may output a logic high value or a logic low value, where the number of logic high values should equal the number of logic low values within a threshold (e.g., +/−1, +/−2) over a predetermined number of comparisons with the output voltage of the CDAC being equal to VCM.

Control logic 110 includes SAR ADC logic to control the CDAC (e.g., 102, 104, 106) and the comparator 108 in a SAR ADC mode and BIST control logic to control the CDAC and the comparator in a CDAC BIST mode to set at least one trimming code (e.g., CAP_TRIM<4:0>) for the SAR ADC mode. In the SAR ADC mode, SAR ADC 100 may receive an input voltage on VIN node 120, convert the input voltage to a digital value, and output the digital value on a DOUT signal path 174. In the CDAC BIST mode, control logic 110 may determine at least one trimming code as described below with reference to FIG. 4 and may output the at least one trimming code on a BIST output (BIST_OUT) signal path 170. Control logic 110 may output a BIST done (BIST_DONE) signal on signal path 172 indicating when the at least one trimming code has been selected and the BIST is complete.

In some examples, the BIST control logic determines a trimming code corresponding to each MSB address of MSB capacitor array 106. The SAR ADC control logic may be configured to apply the trimming code corresponding to a currently selected MSB address to the CDAC in the SAR ADC mode. In the CDAC BIST mode as further described below with reference to FIG. 4, the BIST control logic may be configured to set a current trimming code to an initial trimming code (e.g., CAP_TRIM<4:0>=b00000) and set a current MSB address to an initial MSB address. The BIST control logic may then implement a CDAC function for the current MSB address. As further described below with reference to FIGS. 5A and 5B, the BIST control logic may be configured to implement the CDAC function including a BIST sampling phase and a BIST conversion phase. In the BIST sampling phase, all the LSB capacitors 104 may be charged to a low reference voltage (VREFL) and all the MSB capacitors 106 may be charged to a high reference voltage (VREFH). In the BIST conversion phase, all the LSB capacitors 104 may be connected to VREFH and the MSB capacitors 106 corresponding to the current MSB address may be connected to VREFL.

The BIST control logic may then check the comparator 108 output a selected number of times to obtain a plurality of comparator output values COMPOUTB for the current MSB address and the current trimming code. The BIST control logic may then in response to the plurality of comparator output values comprising an equal number of logic high values and logic low values within a threshold (e.g., +/−1, +/−2), store the current trimming code corresponding to the current MSB address. The BIST control logic may in response to the plurality of comparator output values not comprising an equal number of logic high values and logic low values within the threshold and in response to the current trimming code being less than a maximum trimming code (e.g., b11111), increment the current trimming code and repeat the CDAC function for the current MSB address. In some examples, the BIST control logic may be configured to generate an error in response to the plurality of comparator output values not comprising an equal number of logic high values and logic low values within the threshold and in response to the current trimming code being equal to the maximum trimming code.

In some examples, the BIST control logic may be configured to, in response to storing the current trimming code for the current MSB address and in response to the current MSB address being less than a maximum MSB address, calculate a moving average of the stored trimming codes, increment the current MSB address, set the current trimming code to the initial trimming code, and repeat the CDAC function for the current MSB address. The BIST control logic may be configured to, in response to storing the current trimming code for the current MSB address and in response to the current MSB address being equal to the maximum MSB address, calculate a moving average of the stored trimming codes and set the trimming code to the moving average of the stored trimming codes. The SAR ADC control logic may be configured to apply the set trimming code to the CDAC.

Figure 2A:
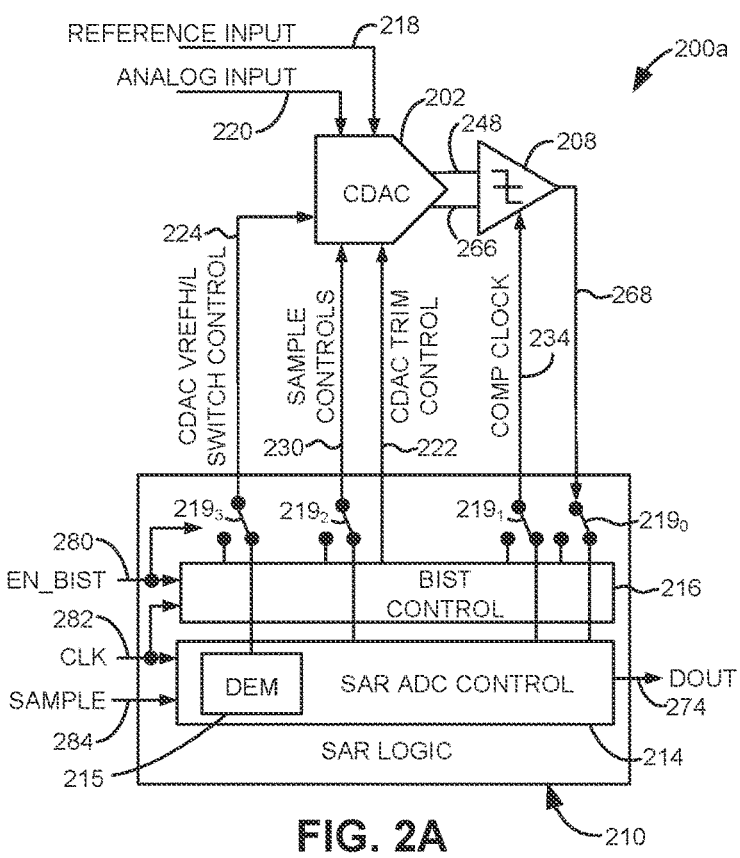
FIG. 2A is a schematic diagram illustrating an example SAR ADC in a SAR ADC mode.

FIG. 2A is a schematic diagram illustrating an example SAR ADC 200a in a SAR ADC mode. SAR ADC 200a includes a CDAC 202, a comparator 208, and control logic 210. Control logic 210 may include SAR ADC control logic 214, BIST control logic 216, and switches $219_0$ to $219_3$. SAR ADC control logic 214 may include a Dynamic Element Matching (DEM) circuit 215. CDAC 202 (which may correspond to trim caps 102, LSB capacitor array 104, and MSB capacitor array 106 of FIG. 1) receives a reference input (e.g., VREFL and/or VREFH) on signal path 218 and an analog input (e.g., VIN) on signal path 220. CDAC 202 is electrically coupled to a first terminal of switch $219_3$ through a CDAC VREFH/L SWITCH CONTROL signal path 224 (which may correspond to signal path 124 and/or 128 of FIG. 1), a first terminal of switch $219_2$ through a SAMPLE CONTROLS signal path 230 (which may correspond to signal path 130 of FIG. 1), and BIST control logic 212 through a CDAC TRIM CONTROL signal path 222 (which may correspond to signal path 122 of FIG. 1). A first output of CDAC 202 (which may correspond to node 148 of FIG. 1) is electrically coupled to a first input of comparator 208 (which may correspond to comparator 108 of FIG. 1) through a signal path 248, and a second output of CDAC 202 (which may correspond to VCM node 166 of FIG. 1) is electrically coupled to a second input of comparator 208 through a signal path 266. A clock input of comparator 208 is electrically coupled to a first terminal of switch $219_1$ through a COMP CLOCK signal path 234 (which may correspond to signal path 134 of FIG. 1). The output of comparator 208 is electrically coupled to a first terminal of switch $219_0$ through signal path 268 (which may correspond to signal path 168 of FIG. 1).

A second terminal of switch $219_3$ is electrically coupled to BIST control logic 216 and a third terminal of switch $219_3$ is electrically coupled to DEM 215 of SAR ADC control logic 214. DEM 215 prevents variations due to bias in the capacitive elements of CDAC 202. A second terminal of switch $219_2$ is electrically coupled to BIST control logic 216 and a third terminal of switch $219_2$ is electrically coupled to SAR ADC control logic 214. A second terminal of switch $219_1$ is electrically coupled to BIST control logic 216 and a third terminal of switch $219_1$ is electrically coupled to SAR ADC control logic 214. A second terminal of switch $219_0$ is electrically coupled to BIST control logic 216 and a third terminal of switch $219_0$ is electrically coupled to SAR ADC control logic 214. Each switch $219_0$ to $219_3$ is controlled by a BIST enable (EN_BIST) control signal on signal path 280. For example, in response to a logic high EN_BIST control signal, the first terminal of each switch $219_0$ to $219_3$ may be electrically coupled to the second terminal of each switch to connect the CDAC 202 and the comparator 208 to BIST control logic 216. In response to a logic low EN_BIST control signal, the first terminal of each switch $219_0$ to $219_3$ may be electrically coupled to the third terminal of each switch to connect the CDAC 202 and the comparator 208 to SAR ADC control logic 214. In some examples, the logic levels of the EN_BIST control signal may be reversed such that a logic low EN_BIST control signal connects the first terminal to the second terminal of each switch $219_0$ to $219_3$ and a logic high EN_BIST control signal connects the first terminal to the third terminal of each switch $219_0$ to $219_3$.

A clock input of BIST control logic 216 and a clock input of SAR ADC control logic 214 receive a clock signal (CLK) through a signal path 282. An input of SAR ADC control logic 214 receives a sample signal through a signal path 284 and outputs a data output (DOUT) signal on a signal path 274 (which may correspond to signal path 174 of FIG. 1).

In the example of FIG. 2A, the BIST control logic is disabled and the CDAC 202 and the comparator 208 are connected to SAR ADC control logic 214 to operate the SAR ADC in a SAR ADC mode. In the SAR ADC mode, an analog input on signal path 220 is converted to a digital value output on DOUT signal path 274 using SAR ADC control logic 214.

Figure 2B:
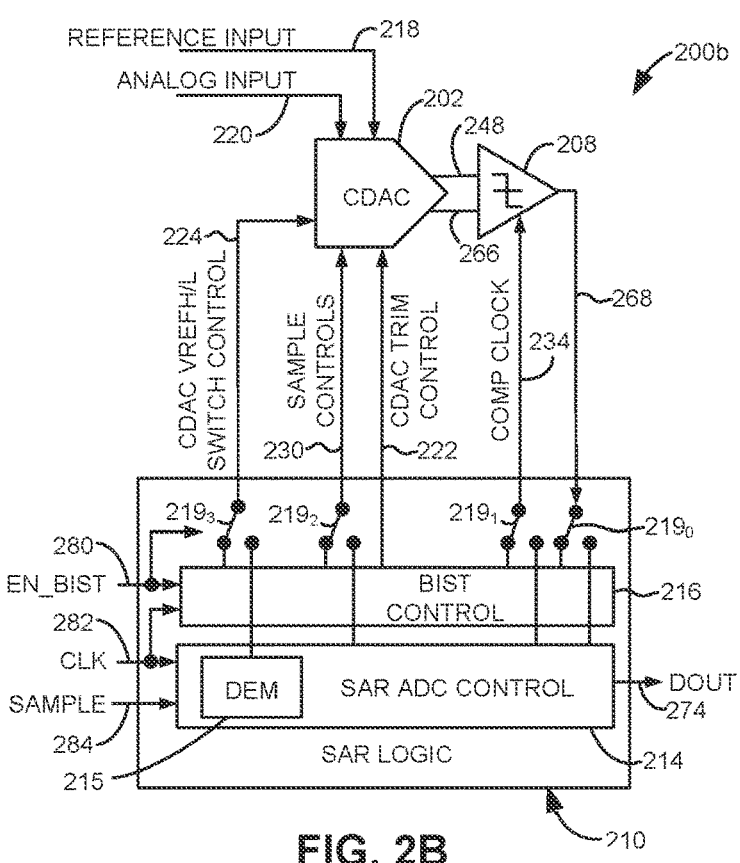
FIG. 2B is a schematic diagram illustrating an example SAR ADC in a Capacitive Digital to Analog Converter (CDAC) Built-In Self-Test (BIST) mode.

FIG. 2B is a schematic diagram illustrating an example SAR ADC 200b in a CDAC BIST mode. In this example, the BIST control logic is enabled and the CDAC 202 and the comparator 208 are connected to BIST control logic 216 to operate the SAR ADC in a CDAC BIST mode. In the CDAC BIST mode, at least one trimming code is determined to trim the CDAC 202 using BIST control logic 216 as described below with reference to FIG. 4. In some examples, once the BIST control logic 216 is enabled, the BIST control logic runs autonomously to determine the at least one trimming code.

Figure 3:
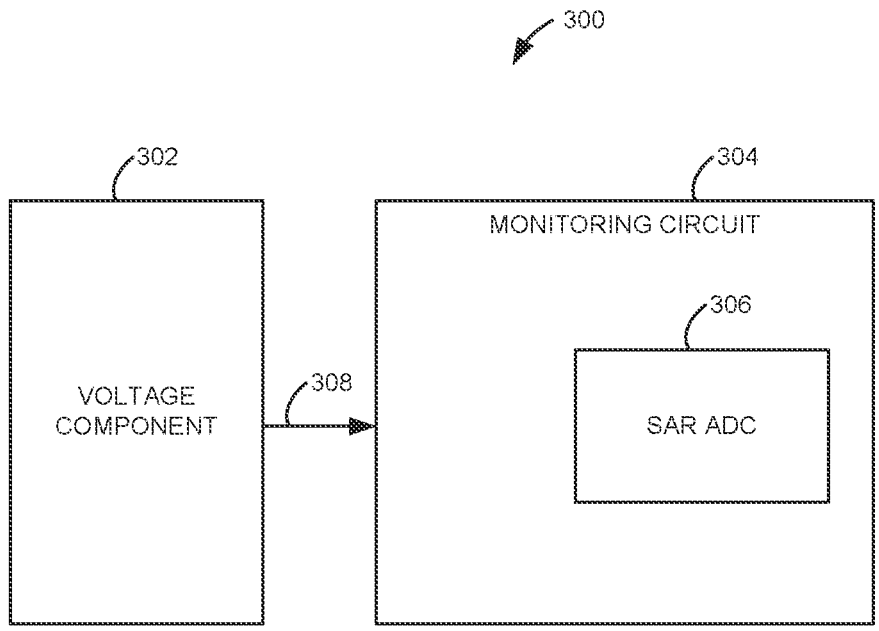
FIG. 3 is a block diagram illustrating an example system including a SAR ADC.

FIG. 3 is a block diagram illustrating an example system 300. System 300 includes a voltage component (e.g., battery, voltage supply, voltage generator, solar panel, energy harvester, etc.) and a monitoring circuit 304. The voltage component 302 may output a voltage signal on signal path 308, which may be monitored by monitoring circuit 304. Monitoring circuit 304 may include a SAR ADC 306 to convert the voltage signal to a digital value to determine the status of the voltage component 302. In some examples, the SAR ADC 306 may include a SAR ADC 100 of FIG. 1 or a SAR ADC 200*a*/200*b* of FIGS. 2A and 2B including BIST control logic to set at least one trimming code for the SAR ADC.

Figure 4:
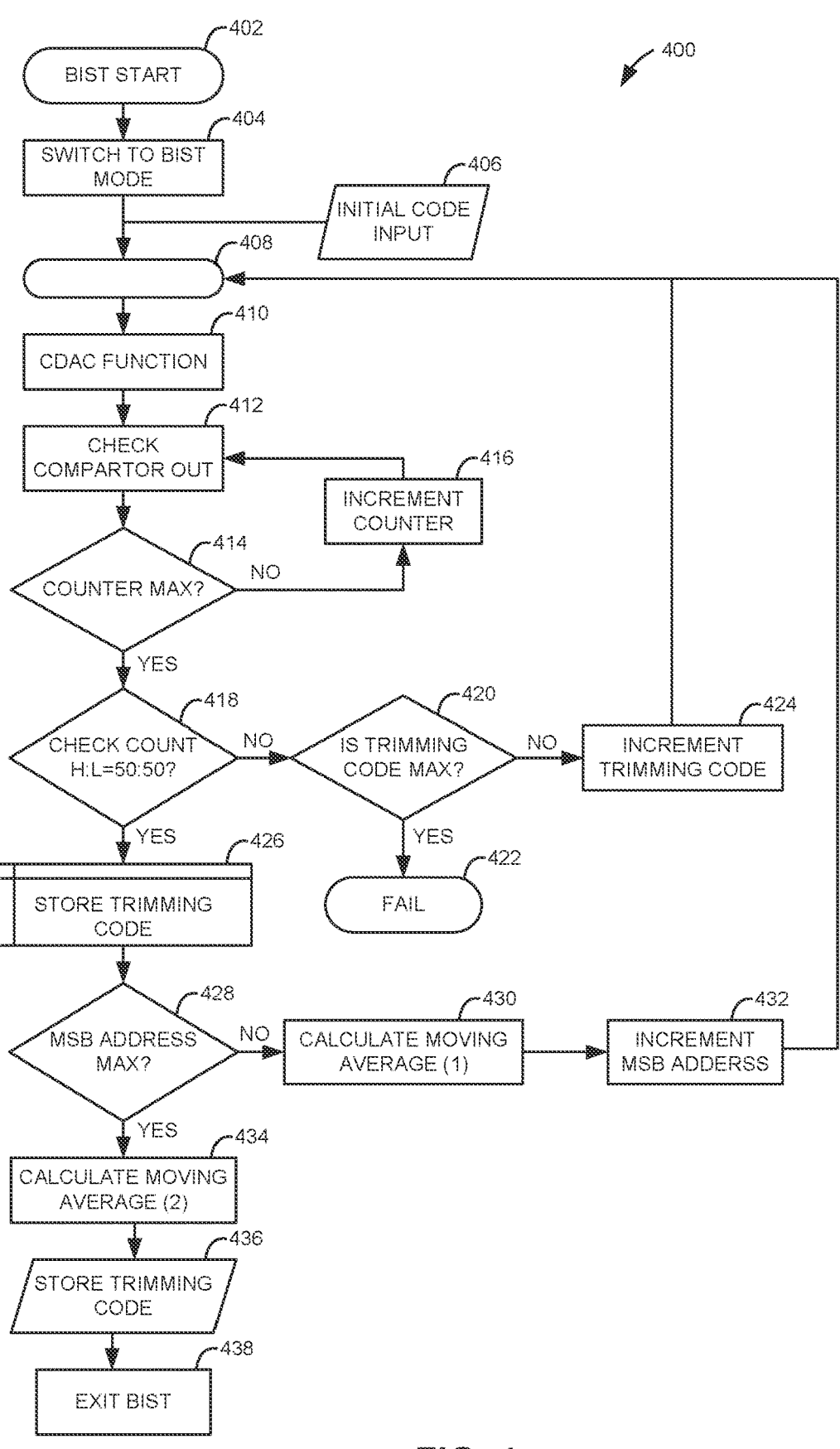
FIG. 4 is a flow diagram illustrating an example method for setting at least one trimming code in a CDAC BIST mode of a SAR ADC.

FIG. 4 is a flow diagram illustrating an example method 400 for setting at least one trimming code in a CDAC BIST mode of a SAR ADC. Method 400 may be implemented by control logic 110 of FIG. 1 or control logic 210 of FIGS. 2A and 2B. At 402, the BIST is started (e.g., in response to the EN_BIST signal on signal path 280 of FIGS. 2A and 2B and/or in response to initially powering on the SAR ADC). Once started, the BIST control logic may run autonomously. At 404, the SAR ADC is switched to the BIST mode (e.g., switches 219₀ to 219₃ of FIG. 2B connect the CDAC 202 and the comparator 208 to BIST control logic 216). At 406, the trimming code (e.g., CAP_TRIM<4:0>) is set to an initial trimming code (e.g., CAP_TRIM<4:0>=b00000) and the MSB capacitor address (e.g., CSEL_LV<37:7>) is set to an initial MSB address.

At 408, a trimming function loop is started. At 410, a CDAC function is implemented for the current MSB address. As further described below with reference to FIGS. 5A and 5B, the CDAC function includes a BIST sampling phase followed by a BIST conversion phase. In the BIST sampling phase, all the LSB capacitors are charged to a low reference voltage (e.g., VREFL) and all the MSB capacitors are charged to a high reference voltage (e.g., VREFH). In the BIST conversion phase, all the LSB capacitors are connected to VREFH and the MSB capacitors corresponding to the current MSB address are connected to VREFL. At 412, the output of the comparator (e.g., 108 of FIG. 1 or 208 of FIG. 2B) is checked to obtain a comparator output value for the current MSB address and the current trimming code. At 414, in response to a counter being less than a maximum value (e.g., a selected number), at 416 the counter is incremented and the output of the comparator is checked again to obtain another comparator output value for the current MSB address and the current trimming code.

At 414 in response to the counter being equal to the maximum value (e.g., selected number), at 418 the count of logic high values and logic low values obtained for the current MSB address and the current trimming code is checked (e.g., where the number of values corresponds to the selected number). In response to an equal number of logic high values and logic low values (e.g., H:L=50:50) within a threshold (e.g., +/−1, +/−2, etc.), the current trimming code is stored at 426 since the optimum trimming code for the current MSB address has been found. In response to the comparator output values not including an equal number of logic high values and logic low values within the threshold and in response to the current trimming code being less than a maximum trimming code at 420, the current trimming code in incremented at 424 and the loop repeats starting at 408 for the current MSB address. In response to the comparator output values not including an equal number of logic high values and logic low values within the threshold and in response to the current trimming code being equal to the maximum trimming code at 420, the trimming function fails at 422 and an error may be generated since none of the trimming codes was determined to be optimal.

At 428, in response to the current MSB address being less than a maximum MSB address, at 430 a moving average (e.g., first moving average) of the stored trimming codes at 426 may be calculated at 430 and at 432 the MSB address may be incremented, the current trimming code may be reset to the initial trimming code, and the loop starting at 408 may be repeated for the current MSB address. At 428, in response to the current MSB address being equal to the maximum MSB address, at 434 a final moving average (e.g., second moving average) of the stored trimming codes at 426 may be calculated and at 436 the trimming code corresponding to the calculated moving average at 434 may be stored. At 438, the BIST may exit. In some examples, the single stored trimming code from 436 may then be applied to the CDAC in the SAR ADC mode such that all MSB addresses use the same trimming code. In some examples, a different stored trimming code from 426 corresponding to a currently selected MSB address may be applied to the CDAC in the SAR ADC mode such that each MSB address uses its own trimming code.

Figure 5A:
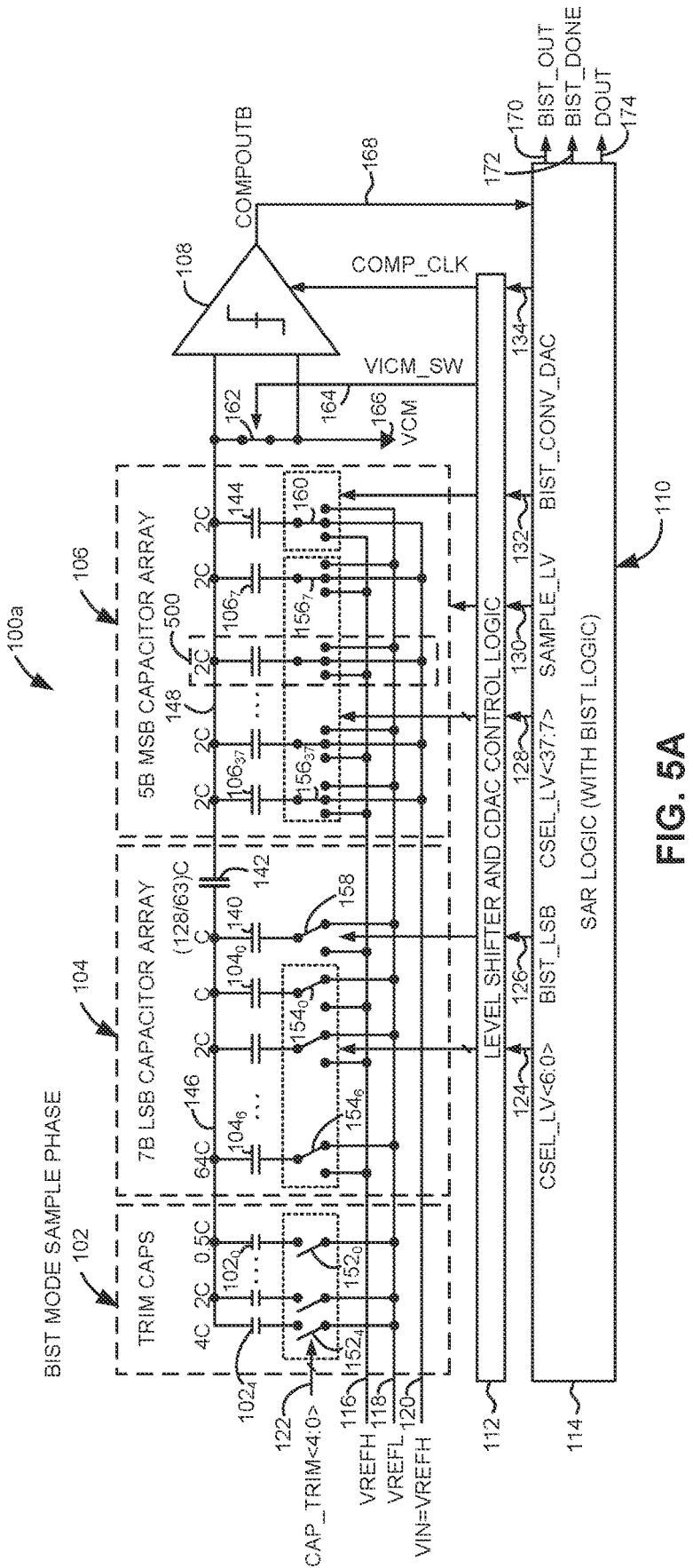
FIG. 5A is a schematic diagram of the example SAR ADC of FIG. 1 in a CDAC BIST mode sample phase.

FIG. 5A is a schematic diagram of the example SAR ADC of FIG. 1 in a CDAC BIST mode sample phase. In the CDAC BIST mode sample phase, all the LSB capacitors 104₀ to 104₆ and capacitor 140 are charged to VREFL on node 118 via switches 154₀ to 154₆ and 158, respectively, and all the MSB capacitors 106₇ to 106₃₇ and capacitor 144 are charged to VIN on node 120, which is set to VREFH, via switches 156₇ to 156₃₇ and 160, respectively. In addition, node 148 is connected to VCM node 166 via switch 162.

Figure 5B:
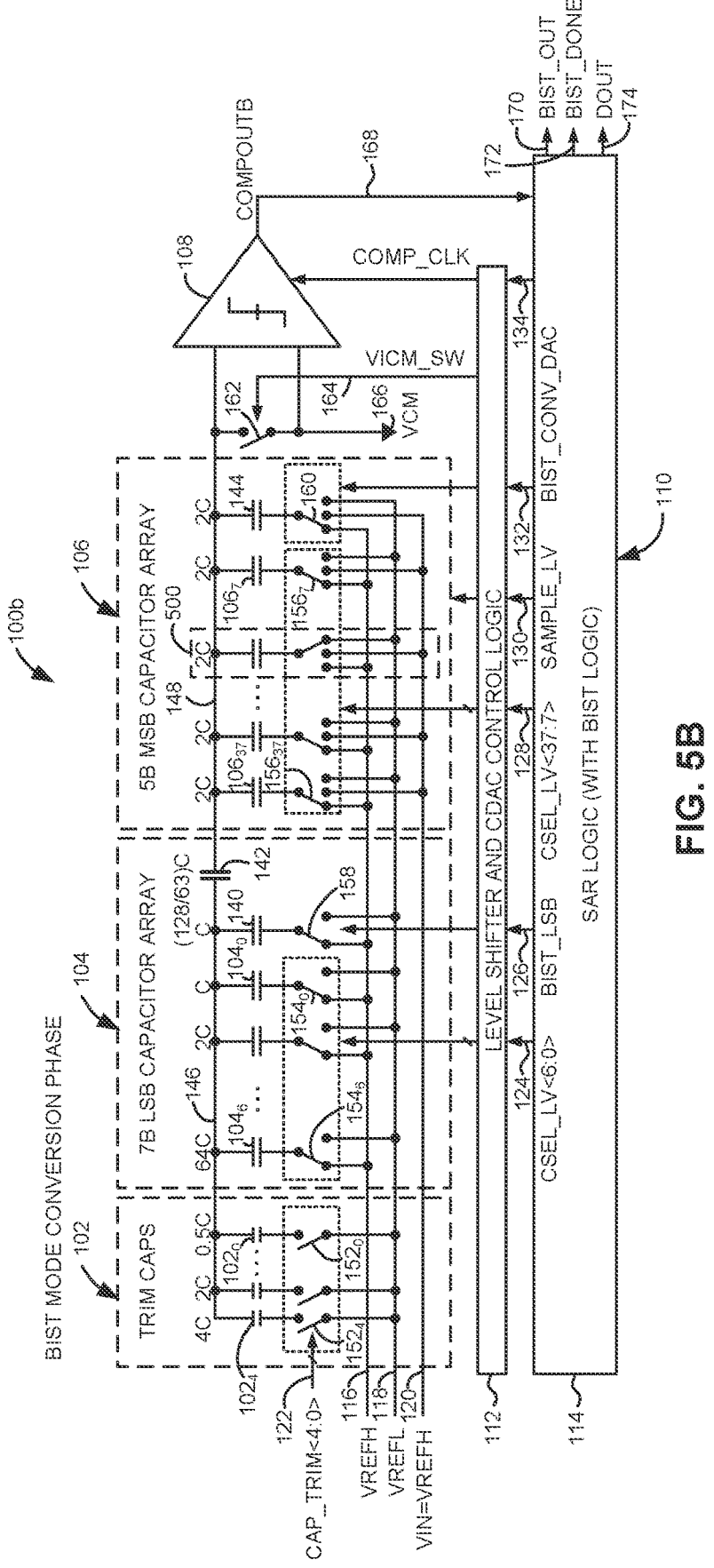
FIG. 5B is a schematic diagram of the example SAR ADC of FIG. 1 in a CDAC BIST mode conversion phase.

FIG. 5B is a schematic diagram of the example SAR ADC of FIG. 1 in a CDAC BIST mode conversion phase. In the CDAC BIST mode conversion phase, all the LSB capacitors 104₀ to 104₆ and capacitor 140 are connected to VREFH on node 116 via switches 154₀ to 154₆ and 158, respectively, the MSB capacitors corresponding to the current MSB address (e.g., 500 in this example) are connected to VREFL on node 118 and the MSB capacitors not corresponding to the current MSB address and capacitor 144 are connected to VRELH on node 116 via switches 156₇ to 156₃₇ and 160, respectively. In addition, node 148 is disconnected from VCM node 166 via switch 162. The comparator then compares the voltage on node 148 to the voltage on VCM node 166 to provide a comparison output in response to each cycle of the clock signal on COMP_CLK signal path 134.

It is to be understood that the features of the various exemplary embodiments described herein may be combined with each other, unless specifically noted otherwise.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

What is claimed is:

1. A Successive Approximation Register (SAR) Analog to Digital Converter (ADC) comprising:

a Capacitive Digital to Analog Converter (CDAC) comprising a plurality of trim capacitors addressed via a trimming code, wherein the plurality of trip capacitors comprises a plurality of Most Significant Bit (MSB) capacitors selected via a MSB address and a plurality of Least Significant Bit (LSB) capacitors;

a comparator coupled to the CDAC to compare an output voltage of the CDAC to a common mode voltage (VCM) to output a logic high value or a logic low value based on the comparison; and control logic comprising SAR ADC control logic to control the CDAC and the comparator in a SAR ADC mode and Built-In Self-Test (BIST) control logic to control the CDAC and the comparator in a CDAC BIST mode to set at least one trimming code for the SAR ADC mode, wherein the BIST control logic determines a trimming code corresponding to each MSB address, and wherein the BIST control logic is configured to:

set a current trimming code to an initial trimming code and set a current MSB address to an initial MSB address, implement a CDAC function for the current MSB address, check the comparator output a selected number of times to obtain a plurality of comparator output values for the current MSB address and the current trimming code, in response to the plurality of comparator output values comprising an equal number of logic high values and logic low values within a threshold, store the current trimming code corresponding to the current MSB address, and in response to the plurality of comparator output values not comprising an equal number of logic high values and logic low values within the threshold and in response to the current trimming code being less than a maximum trimming code, increment the current trimming code and repeat the CDAC function for the current MSB address.

2. The SAR ADC of claim 1, wherein the BIST control logic is configured to:

in response to the plurality of comparator output values not comprising an equal number of logic high values and logic low values within the threshold and in response to the current trimming code being equal to the maximum trimming code, generate an error.

3. The SAR ADC of claim 1, wherein the BIST control logic is configured to:

in response to storing the current trimming code for the current MSB address:

in response to the current MSB address being less than a maximum MSB address, calculate a moving average of the stored trimming codes, increment the current MSB address, set the current trimming code to the initial trimming code, and repeat the CDAC function for the current MSB address; and in response to the current MSB address being equal to the maximum MSB address, calculate a moving average of the stored trimming codes and set the trimming code to the moving average of the stored trimming codes.

4. The SAR ADC of claim 3, wherein the SAR ADC control logic is configured to apply the set trimming code to the CDAC.

5. The SAR ADC of claim 1, wherein the BIST control logic is configured to implement the CDAC function comprising:

a BIST sampling phase to charge all the LSB capacitors to a low reference voltage (VREFL) and to charge all the MSB capacitors to a high reference voltage (VREFH); and a BIST conversion phase to connect all the LSB capacitors to VREFH and to connect the MSB capacitors corresponding to the current MSB address to VREFL.

6. The SAR ADC of claim 1, wherein the SAR ADC control logic comprises a Dynamic Element Matching (DEM) circuit.

7. A system comprising:

a voltage component to output a voltage signal; and a Successive Approximation Register (SAR) Analog to Digital Converter (ADC) to monitor the voltage signal, the SAR ADC comprising:

a Capacitive Digital to Analog Converter (CDAC) comprising a plurality of trim capacitors addressed via a trimming code, wherein the plurality of trim capacitors comprises a plurality of Most Significant Bit (MSB) capacitors selected via a MSB address and a plurality of Least Significant Bit (LSB) capacitors;

a comparator coupled to the CDAC to compare an output voltage of the CDAC to a common mode voltage (VCM) to output a logic high value or a logic low value based on the comparison; and control logic comprising SAR ADC control logic to control the CDAC and the comparator in a SAR ADC mode and Built-In Self-Test (BIST) control logic to control the CDAC and the comparator in a CDAC BIST mode to set at least one trimming code for the SAR ADC mode, wherein the BIST control logic determines a trimming code corresponding to each MSB address, and wherein the BIST control logic is configured to:

set a current trimming code to an initial trimming code and set a current MSB address to an initial MSB address, implement a CDAC function for the current MSB address, check the comparator output a selected number of times to obtain a plurality of comparator output values for the current MSB address and the current trimming code, in response to the plurality of comparator output values comprising an equal number of logic high values and logic low values within a threshold, store the current trimming code for the current MSB address, and in response to the plurality of comparator output values not comprising an equal number of logic high values and logic low values within the threshold and in response to the current trimming code being less than a maximum trimming code, increment the current trimming code and repeat the CDAC function for the current MSB address.

8. The system of claim 7, wherein the control logic is configured to enter the CDAC BIST mode upon power up of the voltage component.

9. The system of claim 7, wherein the BIST control logic is configured to:

in response to storing the current trimming code for the current MSB address:

in response to the current MSB address being less than a maximum MSB address, calculate a moving average of the stored trimming codes, increment the current MSB address, set the current trimming code to the initial trimming code, and repeat the CDAC function for the current MSB address; and in response to the current MSB address being equal to the maximum MSB address, calculate a moving average of the stored trimming codes and set the trimming code to the moving average of the stored trimming codes.

10. A method comprising:

in a Built-In Self-Test (BIST) mode of a Successive Approximation Register (SAR) Analog to Digital Converter (ADC):

setting a current trimming code to an initial trimming code and setting a current MSB address to an initial MSB address;

implementing a CDAC function for the current MSB address;

checking a comparator output of the SAR ADC a selected number of times to obtain a plurality of comparator output values for the current MSB address and the current trimming code;

in response to the plurality of comparator output values comprising an equal number of logic high values and logic low values within a threshold, storing the current trimming code corresponding to the current MSB address; and in response to the plurality of comparator output values not comprising an equal number of logic high values and logic low values within the threshold and in response to the current trimming code being less than a maximum trimming code, incrementing the current trimming code and repeating the CDAC function for the current MSB address.

11. The method of claim 10, further comprising:

in response to the plurality of comparator output values not comprising an equal number of logic high values and logic low values within the threshold and in response to the current trimming code being equal to the maximum trimming code, generating an error.

12. The method of claim 10, further comprising:

in response to storing the current trimming code for the current MSB address:

in response to the current MSB address being less than a maximum MSB address, calculating a moving average of the stored trimming codes, incrementing the current MSB address, setting the current trimming code to the initial trimming code, and repeating the CDAC function for the current MSB address; and in response to the current MSB address being equal to the maximum MSB address, calculating a moving average of the stored trimming codes and setting the trimming code to the moving average of the stored trimming codes.

13. The method of claim 12, further comprising:

exiting the BIST mode; and applying the set trimming code to the CDAC.

14. The method of claim 10, further comprising:

exiting the BIST mode; and applying the trimming code corresponding to a currently selected MSB address to the CDAC.

15. The method of claim 10, wherein implementing the CDAC function comprises:

implementing a BIST sampling phase by charging all the LSB capacitors to a low reference voltage (VREFL) and charging all the MSB capacitors to a high reference voltage (VREFH); and implementing a BIST conversion phase by connecting all the LSB capacitors to VREFH and connecting the MSB capacitors corresponding to the current MSB address to VREFL.

* * * * *